United States Patent [19]
Schorn

[11] Patent Number: 6,014,505
[45] Date of Patent: Jan. 11, 2000

[54] AUTOMATED METHOD FOR OPTIMIZING CHARACTERISTICS OF ELECTRONIC CIRCUITS

[75] Inventor: Eric Bernard Schorn, Austin, Tex.

[73] Assignee: International Business Machines Corporation, Armonk, N.Y.

[21] Appl. No.: 08/761,873

[22] Filed: Dec. 9, 1996

[51] Int. Cl.[7] .................................................. G06F 17/50
[52] U.S. Cl. ........................................................ 395/500.04
[58] Field of Search .................................. 364/488, 489, 364/490, 491, 578; 395/500

[56] References Cited

U.S. PATENT DOCUMENTS

| | | | |
|---|---|---|---|
| 5,459,673 | 10/1995 | Carmean et al. | 395/500.07 |
| 5,557,533 | 9/1996 | Koford | 364/491 |
| 5,568,636 | 10/1996 | Koford | 395/500 |

*Primary Examiner*—Kevin J. Teska
*Assistant Examiner*—Thuan Do
*Attorney, Agent, or Firm*—Anthony V. S. England

[57] ABSTRACT

One aspect of the invention relates to a method for computer aided optimization of a total cost of an electronic circuit, the total cost being a function of a primary cost and at least one secondary cost, the primary and secondary costs being a function of circuit parameters. In one embodiment, the method comprises the steps of selecting an initial vertice, the vertice being defined by specific values of the circuit parameters; selecting a plurality of additional vertices required to define a region; simulating the circuit to determine the primary costs and the secondary costs associated with the vertices in the region; applying a weighting function to the secondary costs which adjusts the secondary costs relative to the deviation of the secondary costs from a predetermined secondary cost target; aggregating the primary costs and the secondary costs to determine individual total costs associated with the vertices in the region.

12 Claims, 7 Drawing Sheets

AUTOMATED METHOD FOR OPTIMIZING CHARACTERISTICS OF ELECTRONIC CIRCUITS

CROSS REFERENCE TO RELATED PATENT APPLICATIONS

This and the following applications for patent are related and filed on the same date: AUTOMATED METHOD FOR CIRCUIT OPTIMIZATION, U.S. patent application Ser. No. 08/761,874.

TECHNICAL FIELD

This invention relates generally to computer aided optimization of system parameters, and more particularly, to a method for optimizing characteristics in the design of electronic circuits.

BACKGROUND OF THE INVENTION

The ability to optimize systems which can be modeled by general non-linear functions of several variables within a constrained region is useful in a variety of fields. For example, in the field of computer circuit design, a particular circuit may be modeled through a circuit analysis program, such as SPICE or ASTAP, to determine its performance in response to defined inputs. Depending on the design requirements, the performance of the circuit may be measured with respect to different objectives, such as the propagation delay, power consumption, layout size, etc., or various combinations thereof. If it is a design goal to optimize the circuit with respect to a certain objective, for example, propagation delay, then the designer will make appropriate changes to the circuit parameters, such as increasing the transistor size in a relevant critical path, to achieve the goal. With each design change, new simulations are run to determine how much improvement was obtained, and to ensure that other circuit objectives are still within design constraints, for example, the increase in transistor size does not cause the circuit to draw an excessive amount of power.

To avoid the inefficiencies of trial and error optimization, techniques have been developed to more efficiently maximize or minimize desired parameters in a given system. Typical optimization techniques include the well known "simplex method," widely used throughout the discipline of operations research, and the modified box complex method. These techniques are described in detail in: M. J. Box, "A New Method of Constrained Optimization and a Comparison With Other Methods," Computer Journal, Vol. 8, pp. 42–52, (1965), and Press et al., "Numerical Recipes in C," pp. 305–309 (Cambridge University Press 1988), both incorporated herein by reference.

However, current algorithms tend to involve complex mathematical equations which, in turn, require significant amounts of computer time to run. This makes accurate determination of optimal parameters time consuming, expensive and, often, impractical in many instances. Moreover, this problem is compounded when the optimization method is "fooled" by a local maxima or minima and repeated optimization runs must be performed to identify actual maximum or minimum values. Further, current algorithms are also sensitive to normal small errors caused by inexact measurement, for example, round off error, low accuracy simulation, etc., of the system.

Accordingly, it is an object of the present invention to overcome the above described shortcomings, and to provide further improvements and advantages which will become apparent in view of the following disclosure.

SUMMARY OF THE INVENTION

One aspect of the invention relates to a method for computer aided optimization of a total cost of an electronic circuit, the total cost being a function of a primary cost and at least one secondary cost, the primary and secondary costs being a function of circuit parameters. In one embodiment, the method comprises the steps of selecting an initial vertice, the vertice being defined by specific values of the circuit parameters; selecting a plurality of additional vertices required to define a region; simulating the circuit to determine the primary costs and the secondary costs associated with the vertices in the region; applying a weighting function to the secondary costs which adjusts the secondary costs relative to the deviation of the secondary costs from a predetermined secondary cost target; aggregating the primary costs and the secondary costs to determine individual total costs associated with the vertices in the region; performing at least one iteration comprising: (a) comparing the individual total costs associated with the vertices in the region with one another to determine a worst cost; (b) determining a centroid defined by the vertices, excluding the vertice associated with the worst cost; (c) determining a new vertice, the new vertice being located on a line defined by the vertice associated with the worst cost and the centroid, the new vertice being located at a distance away from the centroid, the distance being proportional to a distance factor; (d) simulating the new vertice to determine a primary and a secondary cost associated with the new vertice; (e) applying the weighting function to the new secondary cost to adjust the new secondary cost relative to the deviation of the new secondary cost from the predetermined secondary cost target; (f) aggregating the new primary cost and the new secondary cost to determine a new total cost associated with the new vertice; (g) comparing the new total cost associated with the new vertice with the worst cost; (h) adjusting the distance factor and repeating steps c through g, if the total cost associated with the new vertice is not improved relative to the worst cost; and (i) comparing the total cost associated with the new vertice to termination criteria, if the total cost associated with the new vertice is improved relative to the worst cost.

A further aspect of the invention relates to a machine having a memory which contains data representing a total cost of an electronic circuit, the total cost being a function of a primary cost and at least one secondary cost, the primary and secondary cost being a function of circuit parameters. In one embodiment, the data is generated by a method which comprises the steps selecting an initial vertice, the vertice being defined by specific values of the circuit parameters; selecting a plurality of additional vertices required to define a region; simulating the circuit to determine the primary costs and the secondary costs associated with the vertices in the region; applying a weighting function to the secondary costs which adjusts the secondary costs relative to the deviation of the secondary costs from a predetermined secondary cost target; aggregating the primary costs and the secondary costs to determine individual total costs associated with the vertices in the region; performing at least one iteration comprising: (a) comparing the individual total costs associated with the vertices in the region with one another to determine a worst cost; (b) determining a centroid defined by the vertices, excluding the vertice associated with the worst cost; (c) determining a new vertice, the new vertice being located on a line defined by the vertice associated with the worst cost and the centroid, the new vertice being located at a distance away from the centroid, the distance being proportional to a distance factor; (d) simulating the new vertice to determine a new primary and secondary cost associated with the new vertice; (e) applying the weighting function to the new secondary cost to adjust the new secondary cost relative to the deviation of the new secondary cost from the predetermined secondary cost target; (f) aggregating the new primary cost and the new secondary cost to determine a new total cost associated with the new vertice; (g) comparing the new total cost associated with the new vertice with the worst cost; (h) adjusting the distance factor and repeating steps c through g, if the total cost associated with the new vertice is not improved relative to the worst cost; (i) comparing the total cost associated with the new vertice to termination criteria, if the total cost associated with the new vertice is improved relative to the worst cost.

A further aspect of the invention relates to a computer aided method for selecting a number of parameters. In one embodiment, the method comprises the steps of (a) defining 1) a first set of values for an input parameter, 2) a correspondence between values of the input parameter and a first and second output parameter, and 3) a first objective, for the first output parameter, and a second objective, which includes both output parameters; (b) determining a value for the input parameter having a first output parameter value which satisfies the first objective; (c) defining a first output parameter target value based on the first output parameter value from step (b); and (d) determining a value for the input parameter having first and second output parameter values which satisfy the second objective wherein the second objective includes the first parameter target value.

DETAILED DESCRIPTION OF EMBODIMENTS OF THE INVENTION

Figure 11:
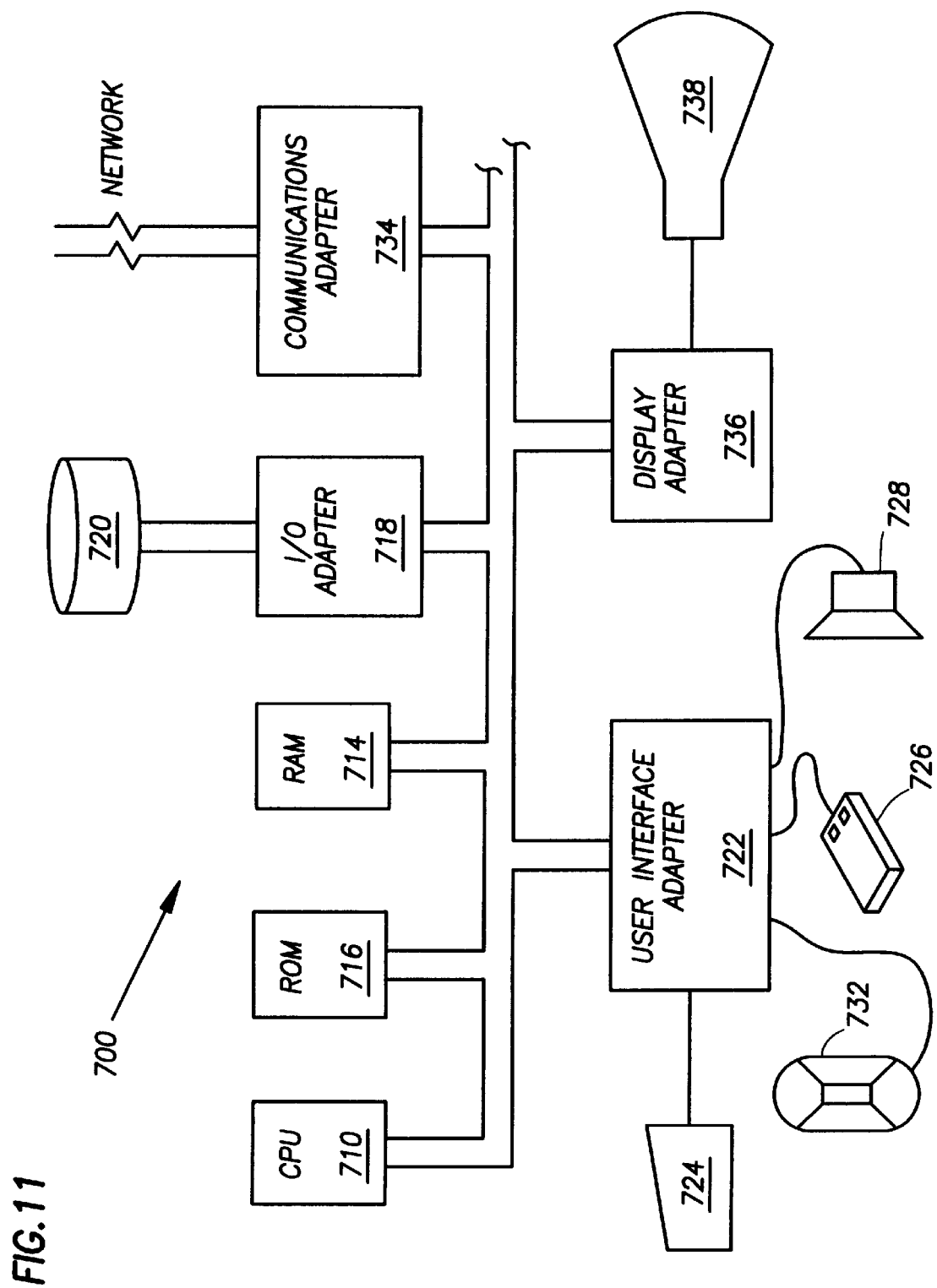
FIG. 11 is a block diagram of a data processing system useful according to the present invention.

Referring first to FIG. 11, an example is shown of a data processing system 700 which may be used for the invention.

The system has a central processing unit (CPU) 710, such as a PowerPC microprocessor ("PowerPC" is a trademark of IBM Corporation) according to "The PowerPC Architecture: A Specification for a New Family of RISC Processors", 2d edition, 1994, Cathy May, et al. Ed., which is hereby incorporated herein by reference. A more specific implementation of a PowerPC microprocessor is described in the "PowerPC 604 RISC Microprocessor User's Manual", 1994, IBM Corporation, which is hereby incorporated herein by reference.

The CPU 710 is coupled to various other components by system bus 712. Read only memory ("ROM") 716 is coupled to the system bus 712 and includes a basic input/output system ("BIOS") that controls certain basic functions of the data processing system 700. Random access memory ("RAM") 714, I/O adapter 718, and communications adapter 734 are also coupled to the system bus 712. I/O adapter 718 may be a small computer system interface ("SCSI") adapter that communicates with a disk storage device 720. Communications adapter 734 interconnects bus 712 with an outside network enabling the data processing system to communication with other such systems. Input/Output devices are also connected to system bus 712 via user interface adapter 722 and display adapter 736. Keyboard 724, track ball 732, mouse 726 and speaker 728 are all interconnected to bus 712 via user interface adapter 722. Display monitor 738 is connected to system bus 712 by display adapter 736. In this manner, a user is capable of inputting to the system throughout the keyboard 724, trackball 732 or mouse 726 and receiving output from the system via speaker 728 and display 738. Additionally, an operating system such as AIX ("AIX" is a trademark of the IBM Corporation) is used to coordinate the functions of the various components shown in FIG. 11.

Figure 1:
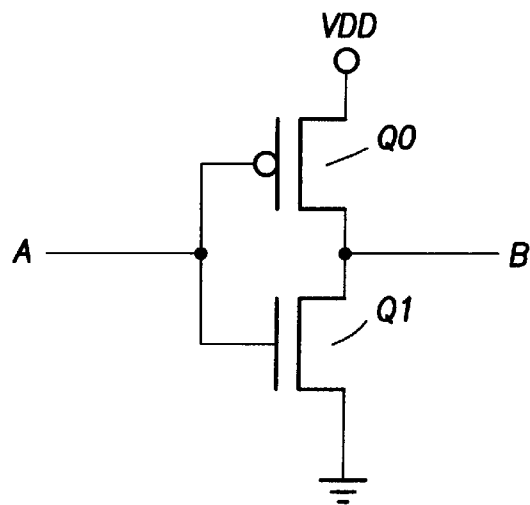
FIG. 1 is a schematic diagram of an inverter circuit for illustrating an embodiment of the invention.

One embodiment of the invention is illustrated with respect to a conventional inverter circuit. FIG. 1 is a schematic diagram of an inverter having a PMOS pull-up transistor Q0 and an NMOS pull-down transistor Q1. An input signal is provided at node A and the inverted output is taken at node B. In this illustration, it will be assumed that the goal is to minimize the propagation delay for a signal to pass through the inverter from input A to output B. As is well known in the art, the propagation delay time of this circuit is proportional to the size of transistors Q0 and Q1. In general, the larger the transistors, the smaller the propagation delay. Of course, the size of each transistor can only be increased within certain limitations. The goal then is to optimize the size of transistors Q0 and Q1, within the predetermined limits, to obtain the smallest propagation delay time.

Figure 2:
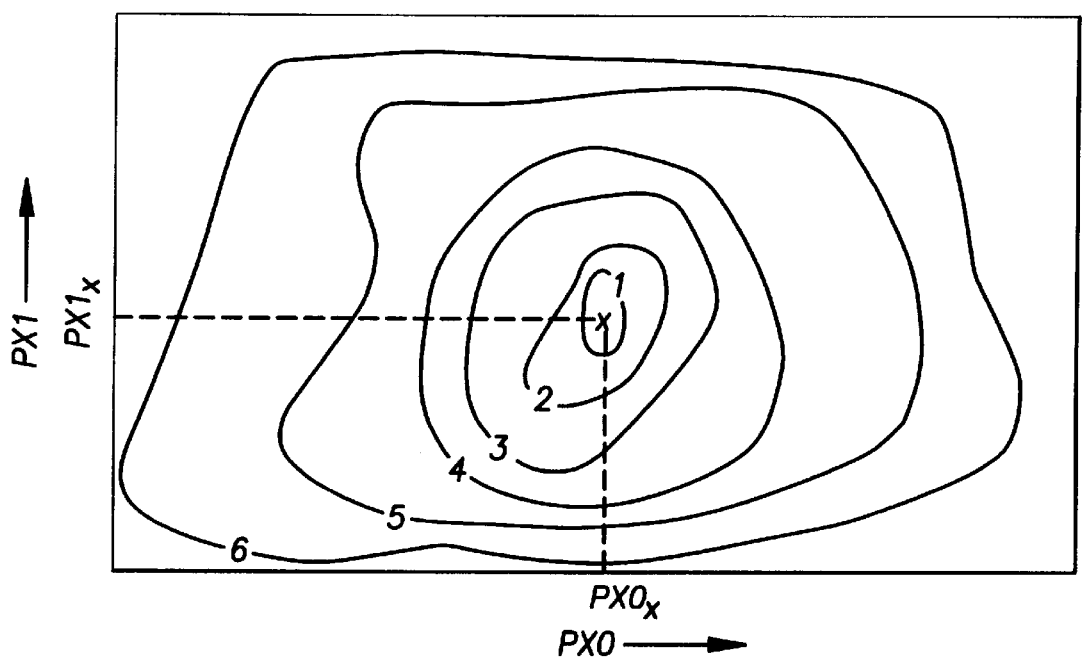
FIG. 2 is a diagram illustrating the problem space for the circuit shown in FIG. 1.

FIG. 2 is a graph of the "problem space" of the desired optimization. Specifically, the horizontal axis of the graph represents the size ("PX0") of the PMOS transistor Q0, while the vertical axis represents the size ("PX1") of the NMOS transistor Q1. These vertices represent an input parameter of the optimization in the exemplary embodiment. In this particular case, the input parameter represents the size of the transistors. The propagation delay through the circuit is plotted on the graph as a series of contour lines 1–6. Each of these contour lines represents a particular propagation delay time. For example, contour line 6 may represent all points at which the propagation delay through the circuit is 600 picoseconds. Similarly, contour line 5 may represent all points on the graph at which propagation delay time is 500 picoseconds, and so forth, so that contour line 1 represents all points in which the propagation delay time is 100 picoseconds. Ultimately, in the center of the graph, the lowest propagation delay time for the circuit in question is represented at point X. At this point, the optimal sizes transistors Q0 and Q1 are at their optimal sizes $PX0_x$ and $PX1_x$, respectively. Thus, the graph may be thought of as a sort of topographical map, with each contour line representing all points (solutions) of the objective to be optimized which have an equal "cost." The value of the objective is often referred to as the "cost", and it is typically desired to reduce the cost to a minimal value. In one embodiment, the objective determines the termination criteria for the optimization so that when the termination criteria is met, the objective is said to be achieved and the optimization is ended.

In this example, the cost to be optimized is, of course, the propagation delay time. As is understood by those of skill in the art, determining the propagation delay for a circuit, such as that shown in FIG. 1, requires the solution of complex non-linear mathematical equations. These equations define a correspondence, or cost function, between the values of the input parameter and the output parameter of the circuit. In this particular case, the output parameter represents the propagation delay time. Thus, the optimization method is advantageously embodied as a system in a computer program capable of interfacing with collateral programs, such as SPICE, ASTAP, or similar circuit analysis tools, required to calculate the cost from the relevant parameters.

Figure 3:
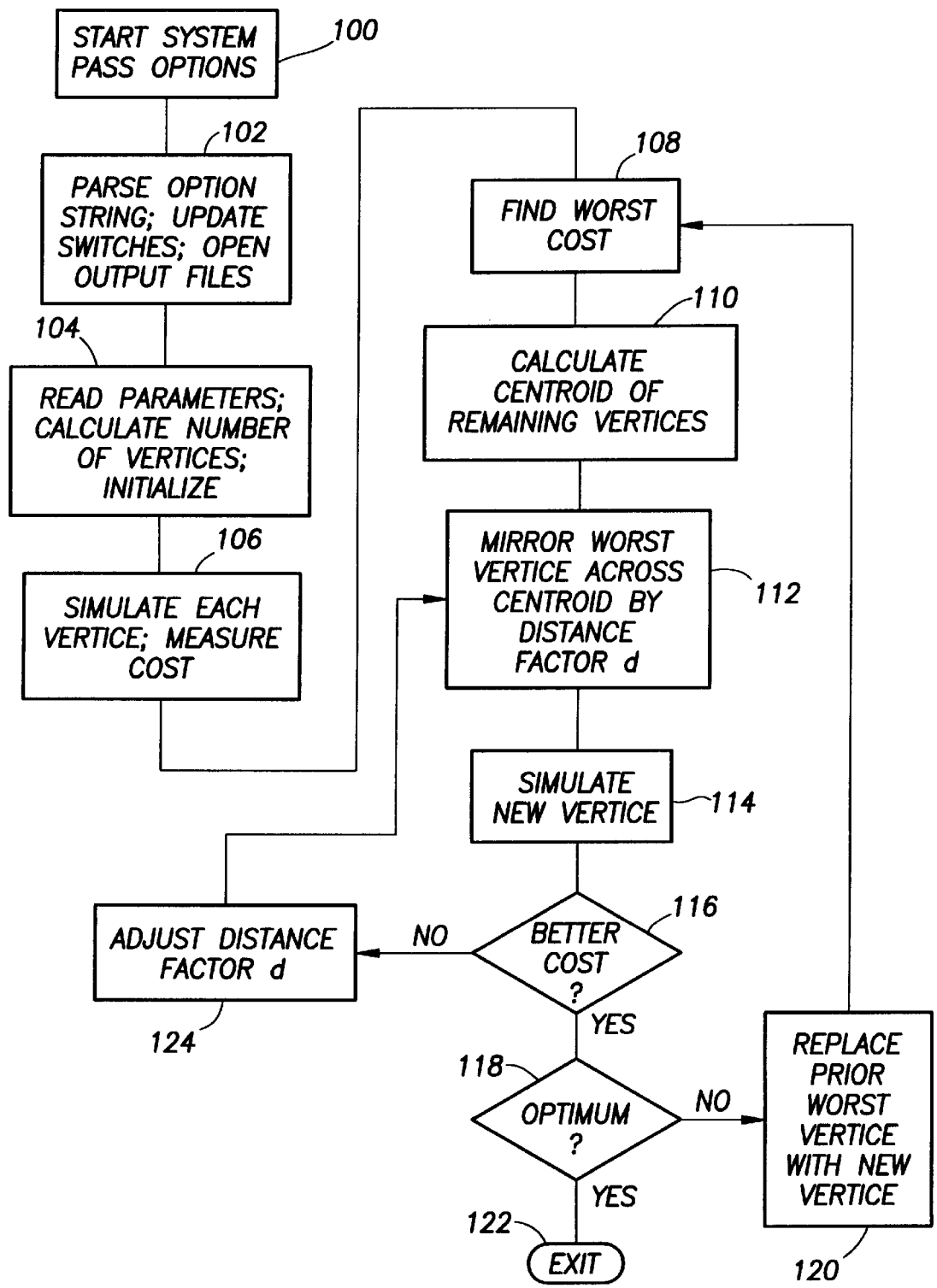
FIG. 3 is a flow chart showing of a process for optimizing system parameters according to an embodiment of the invention.

FIG. 3 is a flow chart illustrating the steps required to determine the optimal propagation delay time according to one embodiment of the invention. Beginning with step 100, the optimization system is first invoked. Invoking the system can be performed in several ways as a matter of design choice. For example, the system may be invoked by initiating an executable file from the command line, or an icon, of a workstation. Alternately, the system may be called as a subroutine from a collateral program, such as SPICE, currently running on the workstation. In any case, when the system is invoked, an option string may be passed to the system to particularize its behavior.

In step 102, the optimization system parses the option string in a conventional matter in order to determine what functions to perform, and how to perform them. For example, in this particular illustration, the optimization system is provided with the name and location of the file containing the schematic diagram of the circuit to be optimized, the relevant parameters assigned to the circuit components, the cost function to be optimized, an initial starting point from which to begin optimization and values for internal switches, such as the distance factor alpha. Once the command line is parsed, the optimization system then performs any necessary overhead required for its proper operation on the workstation, such as updating internal switches, and opening output files.

The system then proceeds to step 104 where it reads parameters from the relevant files and calculates the number of vertices needed. As used herein, a vertice refers to a point on the graph of the problem space. In this particular example, each vertice defines a transistor size Q0 and Q1. For an N-dimensional problem, i.e., the cost is a function of N-parameters, at least N+1 vertices are required. This is because N+1 vertices are required to form a region which will eventually encompass the optimal point X. In this embodiment, the vertices represent a first set of values for an input parameter which includes the initial vertex and the vertices of the region. Therefore, in two dimensions the region is a triangle, and in three dimensions a tetrahedron. In more than three dimensions, the region is described mathematically. The system then initializes by selecting the required additional vertices. Of course, in other embodiments, more than N+1 vertices can be used to form the region. Defining a region with more than N+1 vertices is often useful because, as seen above, the regions are non-regular in shape. Thus, some shapes of regions, such as long, narrow triangles, are not well suited to perform optimization. Thus, it is possible to improve the optimization by changing the shape of the regions through the addition of vertices. In one particular embodiment, the number of vertices required is given by the equation: number of vertices=$C_1+(C_2*N)+(C_3*N^2)$, where $C_1$, $C_2$ and $C_3$ are constants selected by the user and passed to the system through the option string, and N is the number of parameters. In one, even more specific, embodiment of the invention, it is found that when $C_1$=1, $C_2$=1.65 and $C_3$=0, particularly good results are obtained. When the equation above results in a non-integer number, the results may be rounded. In one embodiment, it is useful to always to round up the number of vertices required.

Figures 4, 5:
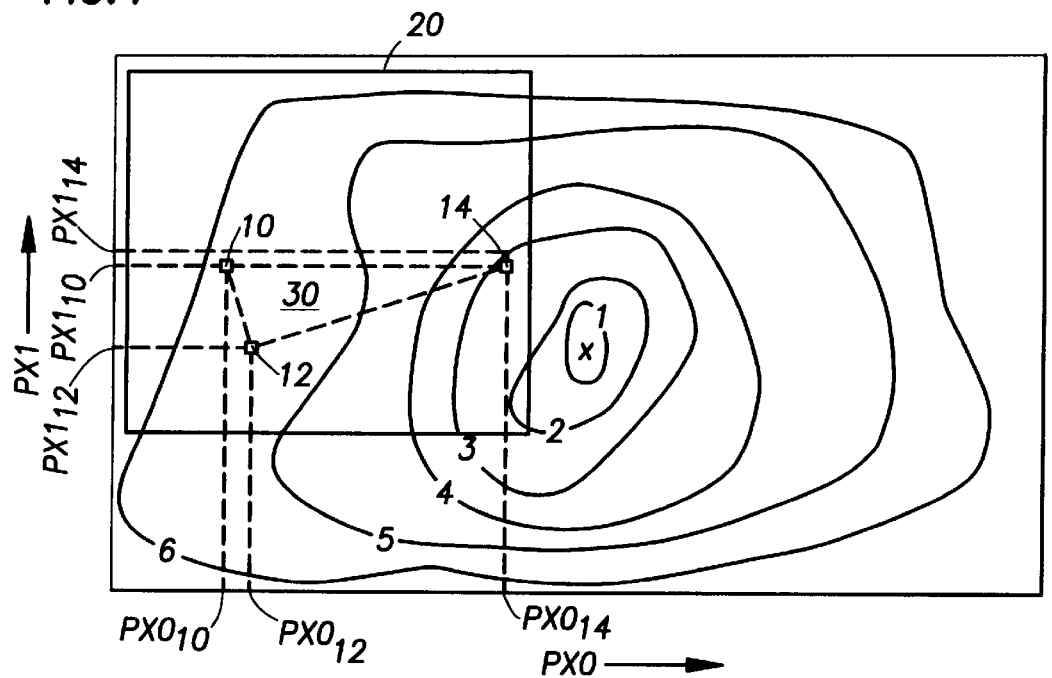
FIG. 4 is a diagram illustrating the selection of a first set of vertices according to an embodiment of the invention.
FIG. 5 is a diagram illustrating the mirroring of a new vertice according to an embodiment of the invention.

FIG. 4 is a, graph showing the problem space after step 104. In this case, vertice 10 represents the initial point selected to begin the optimization. This point is generally estimated by the circuit designer based on rough calculations or experience. Since the cost, i.e., the propagation delay time in this case, is a function of two parameters PX0, PX1, then at least (2+1) or 3 vertices are required. The optimization system then calculates two more vertices, 12 and 14, to form a region 30.

In one preferred embodiment, additional vertices 12 and 14 are randomly selected. Random selection is advantageous because the possibility exists that the optimization system may find an anomaly, such as a local minima, which it may mistake for the optimal value. Choosing the additional vertices at random ensures that the initial region 30 will be different from one run to the next. Thus, subsequent runs of the system are likely to avoid the same anomalies and are statistically more likely to find the absolute optimum value. Moreover, it is frequently advantageous to restart a multi-dimensional minimization routine at a point which the prior run identified as the optimal point. By randomly selecting vertices, multiple restarts may begin at the same initial value without duplicating the previous results. Of course, it is also possible to begin the optimization process with a different region 30 by selecting a different initial point 10.

Even though the additional vertices are randomly selected, it is advantageous that they be kept within certain limits. Therefore, it is advantageous to define a range for acceptable vertices. In the embodiment shown in FIG. 4, a range 20 is defined. In this case, range 20 is illustrated as a box within which random vertices 12 and 14 must be placed. In one specific embodiment, the range is defined in terms of plus or minus a percentage of the distance from the initial vertice. After the first set of vertices is determined, the range 20 is no longer used.

The system then proceeds to step 106 in which the optimization system determines the cost for each of the vertices 10, 12 and 14. Since in this case, the cost is defined as the propagation delay time of the circuit shown in FIG. 1, determining the propagation delay time involves simulating the performance of the circuit at each of vertices 10, 12 and 14. Suitable circuit simulators are well known in the art, for example SPICE or ASTAP. Simulation requires three iterations to be performed by the circuit simulator. In the first iteration, the transistor sizes $PX0_{10}$ and $PX1_{10}$ for vertice 10 are provided to the circuit simulator, and propagation delay time corresponding to vertice 10 is calculated. In the second iteration transistor sizes $PX0_{12}$ and $PX1_{12}$ are simulated and in the third iteration, transistor sizes $PX0_{14}$ and $PX1_{14}$ are simulated for the circuit shown in FIG. 1 and the cost associated with the corresponding vertices is determined.

In step 108, the results of the three simulations are compared, and the vertice yielding the worst propagation delay time is identified. In this case, it is seen from FIG. 4 that vertice 10 has the highest cost in relation to the other vertices.

Once the worst vertice is identified, the system proceeds to step 110 in which the optimization system then calculates the centroid of the line segment defined by the remaining vertices 12 and 14. In this case, the centroid is simply the midpoint of the line segment. For more complex situations involving three or more vertices, the centroid is determined by mathematical techniques which are well known to those skilled in the art and will not be further described here. Referring now to FIG. 5, the centroid 16 is shown on the line segment between vertices 12 and 14.

Next, in step 112, a line is defined by the worst vertice and the centroid. The worst vertice is projected along this line, through the centroid, to a location which is a predetermined distance away from the centroid. In one embodiment of the invention, the distance of the projected point away from the centroid is determined by multiplying the length of the line segment defined by the worst vertice and the centroid by a distance factor, sometimes referred to as alpha. Here, the line segment defined by vertice 10 and centroid 16 has a length of d. The distance factor, alpha, is set to 1.3. Thus, the length of the line segment defined by the centroid 16 and the projected point 18 is 1.3d. Naturally, the distance factor alpha is a matter of design choice, and may be customized to suit the needs of a particular design.

Figure 6:
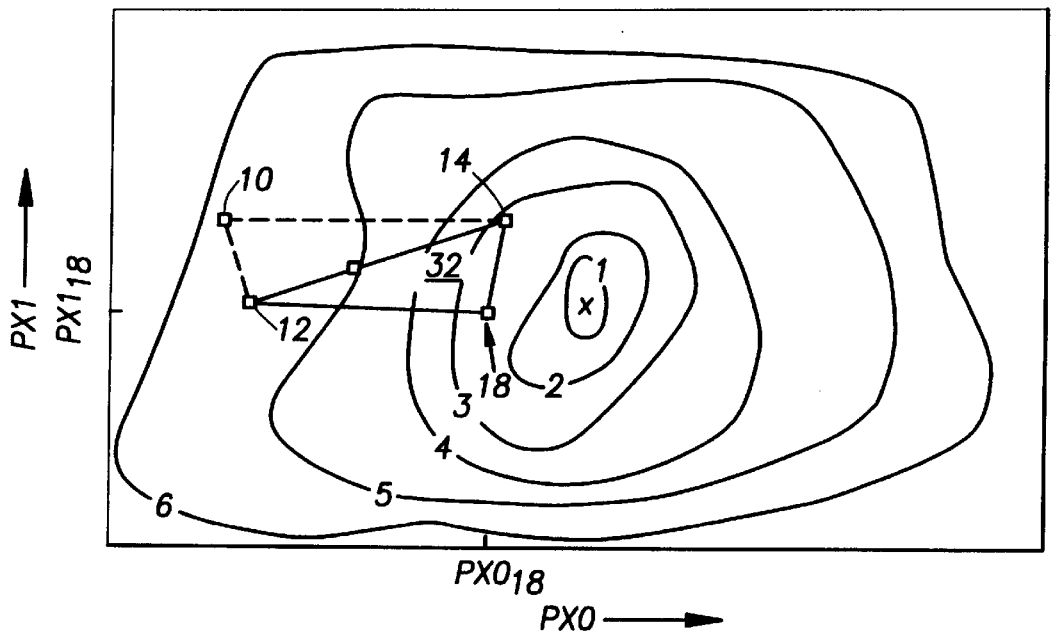
FIG. 6 is a diagram illustrating the formation of a new region according to an embodiment of the invention.

Projected point 18 now becomes a new vertice which, along with vertices 12 and 14 define a new region 32. This is illustrated in FIG. 6. Having defined new region 32, the new vertice 18 is simulated in step 114 and the cost of this new vertice is determined. In step 116, the cost of the new vertice, here, the propagation delay time of the circuit of FIG. 1 having transistor sizes of $PX0_{18}$ and $PX1_{18}$, is compared to the propagation delay time of the previous worst vertice 10. If the new vertice 18 results in a better propagation delay time, then the system proceeds to step 118 where the cost associated with vertice 18 is compared against termination criteria to determine whether optimization is complete, or whether additional iterations will be performed.

Various termination criteria can be used as a matter of design choice. For example, a predetermined desired propagation delay time may be provided as a parameter to the optimization system. The propagation delay time associated with vertice 18 is then compared with the desired propagation delay time to see if it falls within a certain tolerance factor. If so, the optimization system terminates, and the results are supplied to the circuit designers through conventional means, such as CRT displays, paper printouts, or data stored in a computer readable medium.

In other embodiments, more complex termination criteria can be used. For example, in one embodiment, the size of the geometric shape of the region can serve as a termination criteria. As the geometric shape shrinks to some preset minimal size, it can trigger the termination criteria. To illustrate, if the cost is measured in terms of the propagation delay, and the cost associated with all vertices of the region are within one picosecond of each other, then the best solution of the vertices may be considered to be optimal, and the system terminated.

In another embodiment, the parameters may be used as termination criteria. For example, if it is desired to optimize device sizes, and each vertice is within, for example, one percent of the other, then, as a matter of design choice, this may be sufficient to terminate the system.

Figure 7:
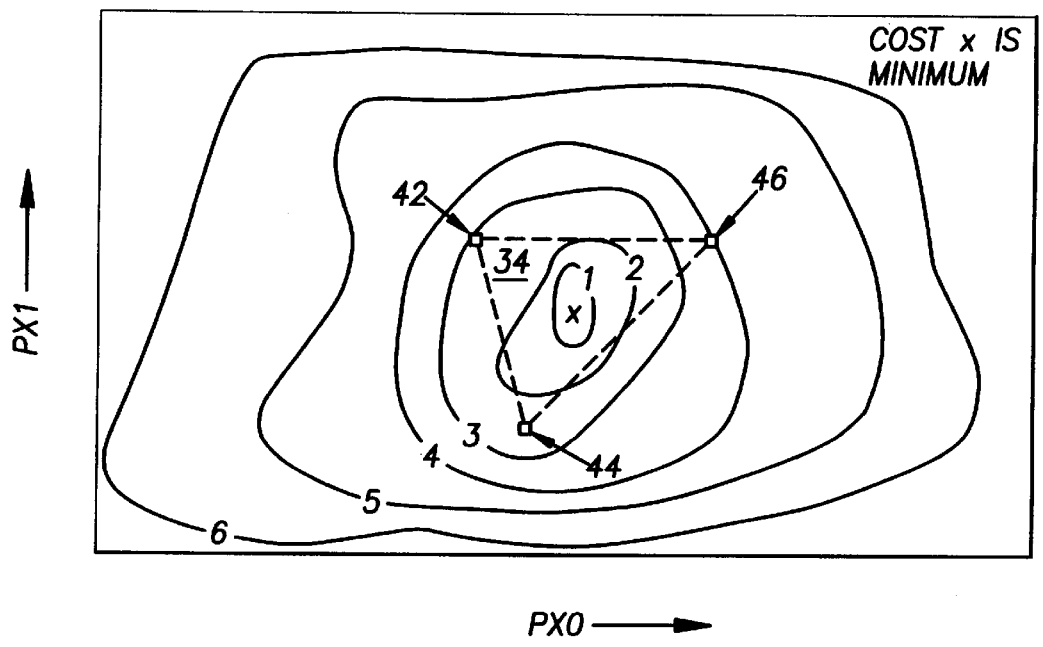
FIG. 7 is a diagram illustrating a region encompassing an optimal point according to an embodiment of the invention.

If the newly generated vertice does not meet the termination criteria, the system proceeds to step 120 in which vertice 10 is deleted and the new region 32 now consists of vertices 12, 14 and 18. Then the system proceeds back to step 108 to search for the current worst vertice. In this case, the worst vertice is now vertice 12, and the system proceeds to mirror this vertice across the centroid of the line segment defined by vertices 14 and 18. The circuit performance of the newly created vertice is simulated and tested to see whether the new vertice results in a better cost, or if it meets the termination criteria. Thus, as long as each new vertice results in a better cost than the prior worst vertice and does not meet the termination criteria, then the system will perform repeated iterations of steps 108–120. Each iteration causes the region to "walk" or "flip" across the problem space, the region growing larger with, each iteration. Eventually, the region will encompass the optimal point. This is shown in FIG. 7, in which it is seen that region 34, comprising points 42, 44 and 46 encloses the optimal point X.

Figure 8:
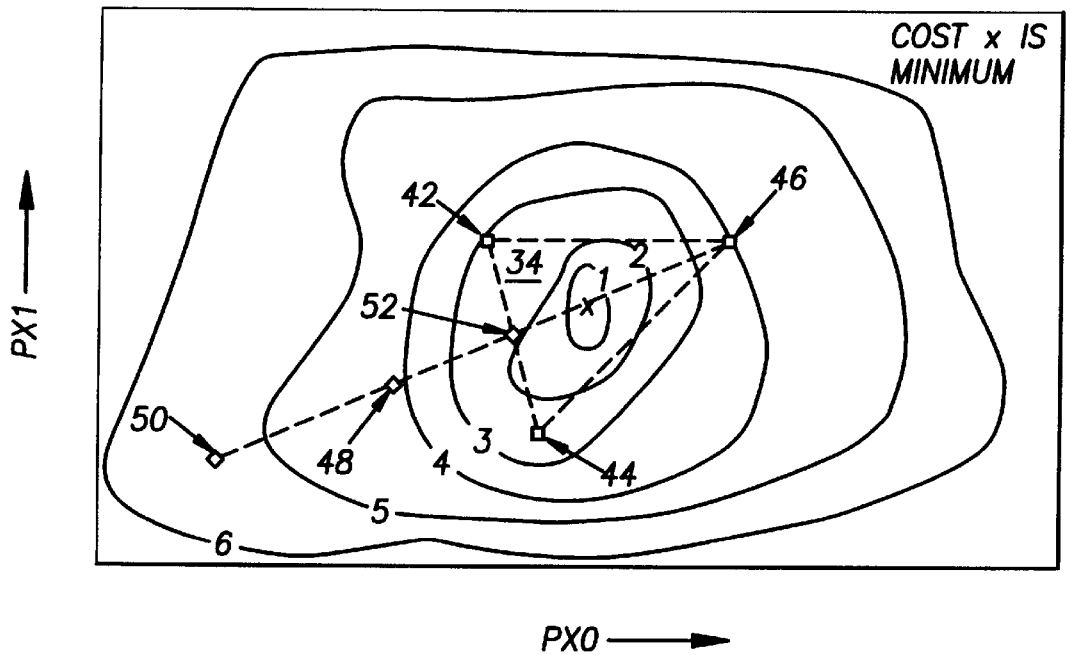
FIG. 8 is a diagram illustrating the selection of a new vertice according to an embodiment of the invention.

Once the optimal point is enclosed, in some cases, the next iteration will generate a new vertice which is does not improve the cost of the worst vertice. This is shown in FIG. 8. In this case, vertice 46 is mirrored through the centroid of the line segment defined by vertices 42 and 44, by a distance factor, alpha. This results in vertice 50. Vertice 50 is simulated in step 114 then in step 116, compared against the simulation of vertice 46. Since vertice 50 does not result in improved cost, the system proceeds to step 124. In step 124, the distance factor is adjusted in preparation of performing another iteration of steps 112–116 to find a vertice with an improved cost. Numerous ways will occur to those of skill in the art to adjust the distance factor depending on the specific circumstances of the optimization problem involved. For example, in one embodiment, the distance factor, is reduced by half. Flow then proceeds to step 112 and vertice 46 is again mirrored across the centroid 52 of the line segment defined by vertices 42 and 44. However, for this iteration, the distance factor of alpha is reduced to 0.65. This results in new vertice 48. New vertice 48 is then simulated in step 114 and the result is compared to the cost determined at vertice 46.

If the cost (i.e., propagation delay time in this example) at vertice 48 is better than that at vertice 46, a new region is formed, consisting of vertices 42, 44 and 48, the distance factor of alpha is increased back to 1.3, and the system again performs successive iterations of steps 108–120. However, if the propagation delay time at vertice 48 is not better than the propagation delay time at vertice 46, then flow again proceeds to step 124. In this case, the distance factor alpha is further reduced. Thus, it is seen that each time the mirroring of the worst vertice does not produce a better cost value, the region 34 tends to shrink in size with each iteration.

Figure 9:
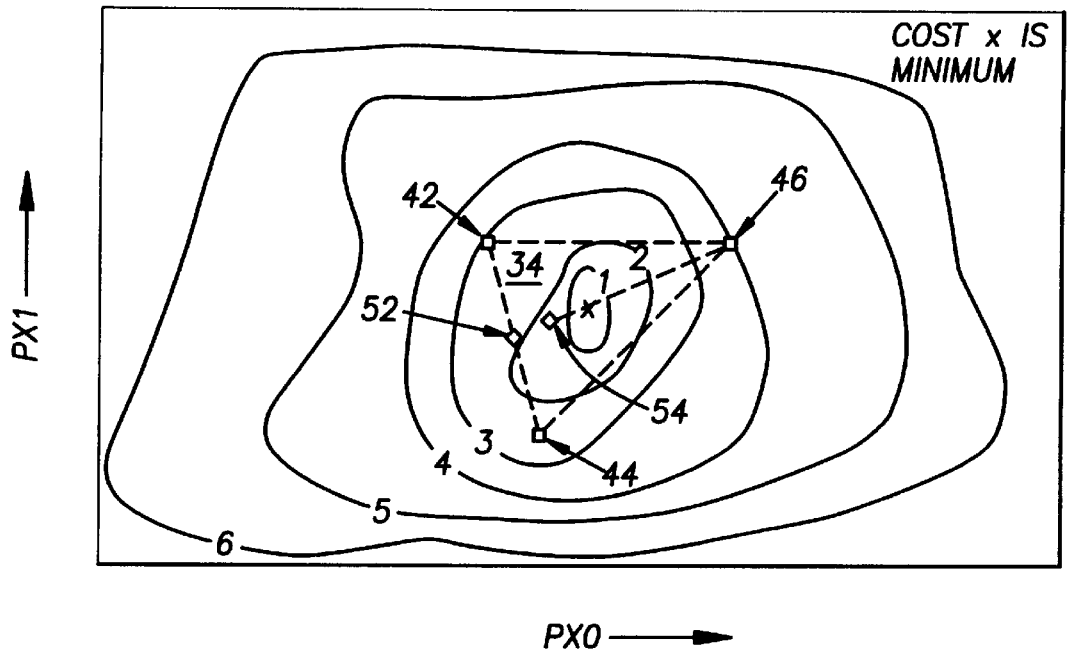
FIG. 9 is a diagram illustrating the formation of a new vertice according to still another embodiment of the invention.

In one embodiment of the invention, to further shrink the region, the distance factor alpha can be multiplied by −1 so that the newly created vertice is actually inside the region itself. This is seen in FIG. 9. In this case, the newly created vertice 54 lies on the line segment defined by point 46 and centroid 52, inside region 34. If vertice 54 yields a better propagation delay time then vertice 46, then a new region is formed by vertices 42, 44 and 54, distance factor alpha is increased back to 1.3, and again, the system begins iterating steps 108–120.

In a more specific embodiment, adjusting the distance factor according to step 124 also involves keeping track of the number of consecutive times that the system fails to find a better vertice, and dynamically changing the adjustment method. For example, in the above embodiment, alpha was simply divided by two and flow proceeded to step 112 as shown in FIG. 3. This is done each time the system fails to find a vertice having an improved cost. Thus, in another embodiment of the invention step 124 counts the number of times this iteration is performed. When the number of consecutive failures reaches some predetermined threshold, alpha is set to a negative value, such as −0.65 so that the new vertices will search inside the region defined by the other vertices.

In still a further embodiment, assuming that the system continues to fail to find improved vertices the number of consecutive failures reaches some secondary threshold, causing the system to change the strategy again. In this embodiment, the centroid is perturbed, i.e., moved some distance from its present location. Note, the location of the remaining vertices are not actually changed, therefore, the centroid, as mathematically defined, does not move. Rather, the result of the centroid calculation itself is perturbed. The centroid can be perturbed in a random fashion, or it can be moved in some predetermined fashion, for example, the centroid could be calculated based on all but the first two vertices. By perturbing the centroid, the line segment that the system searches along to locate the new vertices is changed. Thus, the system is not constrained to search only along the line defined by the worst vertice and the centroid of the remaining vertices, but rather, by changing the origin of one of the points, i.e., the centroid, a slightly different line to search along is provided. In still a further embodiment of the invention, an additional threshold can be defined to determine when, despite all efforts by the system, no improved vertice is found. This serves to prevent infinite loops.

Figure 10:
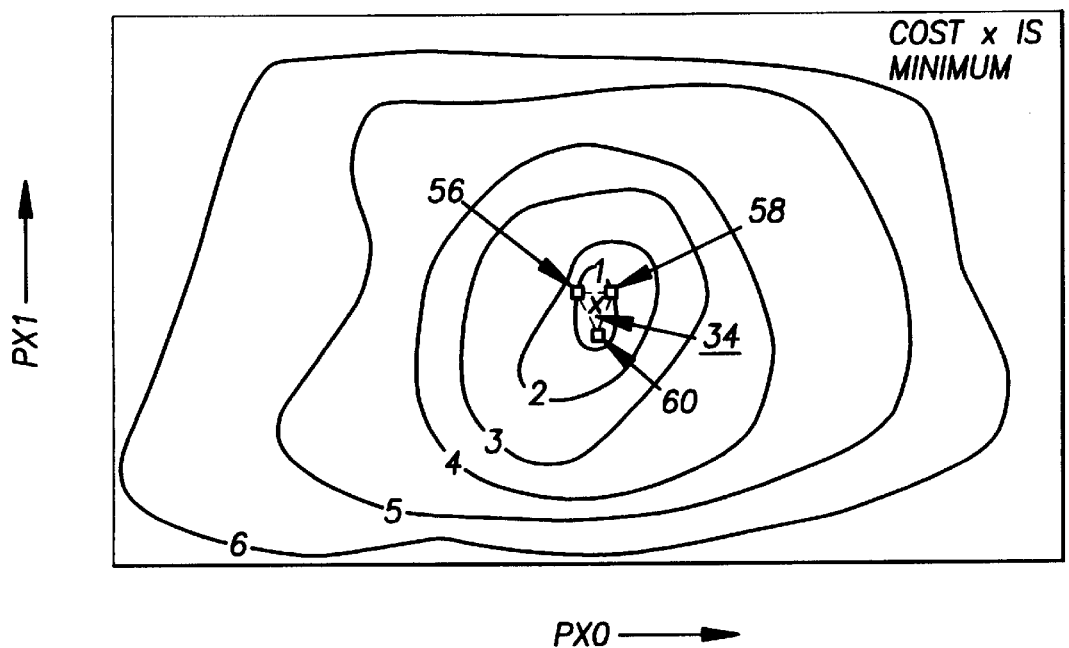
FIG. 10 is a diagram illustrating a region encompassing an optimal point according to another embodiment of the invention.

Thus, it is seen that, in this embodiment, steps 108–120 comprise a first iteration of steps, or loop, and steps 112-124 comprise a second loop within the first loop of steps which can be executed independently of the first iteration depending on the results of the test in step 116. Eventually, through the above described process of growing and moving the region until it encloses the optimal point then shrinking it back down, the system will reach the situation illustrated in FIG. 10 in which the optimal point X is enclosed by a very small region 34 consisting of points 56, 58 and 60. If desired, continued iterations could be performed to close in even further by adjusting the termination criteria.

In the above described embodiments, it has been assumed that determining whether a newly created vertice has an improved cost relative to the prior worst vertice involves a simple comparison between two scalar values. For example, if the circuit analysis reveals that the propagation delay time of a circuit with parameters corresponding to the new vertice is one nanosecond, and with the parameters set to the prior worst vertice is two nanoseconds, then the new vertice is held to have an improved cost.

However, this is often an oversimplification which ignores the influence of other factors in determining the optimal point. For example, it was stated previously that the propagation delay time generally decreases as the size of the transistors is increased. But there must also be some constraint on the transistor sizes. Although the propagation delay time at the newly created vertice may be lower, the transistor sizes associated with the vertice may be too large to be practical in the integrated circuit.

Therefore, in another embodiment of the invention, a complex cost function is used to determine whether the new vertice results in an improved cost. In the complex cost function, the total cost associated with the new vertice is determined as a function of a primary cost, i.e., the actual objective to be optimized, and at least one secondary cost which represents another circuit objective which is influenced as a result of the optimization primary cost. The secondary cost is normally modified by a weighting function which adjusts the value of the secondary cost relative to the deviation of the secondary cost from a predetermined secondary cost target.

To illustrate, one specific example of a complex cost function is: $cost = K_1 * (POWER_{target} - POWER_{actual})^2 + K_2 *$ propagation delay. Where $POWER_{target}$ is the predetermined target value for the power consumption of the circuit, $POWER_{actual}$ is the actual power consumption of the circuit, and $K_1$ and $K_2$ are scaling factors giving the two objectives (power consumption and delay) a relative importance.

Thus, the cost is defined as a function of the power consumption, as well as the propagation delay time where the primary cost is the propagation delay time and the secondary cost is the power consumption. A desired target power consumption is provided to the cost function. As actual values for the power consumption are determined according to the process described previously, they are compared to the desired target values by the weighting function. In this case, the weighting function is simply the square of the differences between the target power consumption and the actual power consumption. If the actual power consumption is equal to the target power consumption, then it is seen that the first term of the equation is zero and the cost is simply the propagation delay time. However, as the actual power consumption exceeds the target power consumption, then the first term in the cost function becomes quite large relative to the propagation delay time. Thus, even though the propagation delay time associated with a first vertice may be lower than the propagation delay time associated with a second vertice, the total cost function of the second vertice will increase exponentially as the power consumption deviates from the target.

In still a further embodiment, there is provided a computer aided method for selecting a number of parameters. In this embodiment, the method involves first defining a first set of values for an input parameter. Next, a correspondence between values of input parameter and a first and second output parameter are defined. It will be clear to those of skill in the art that the input parameter relates to the values required to generate the first and second output parameters as a function of a correspondence between them. For example, in the examples described above, the input parameter is related to the sizes of the transistors, where the first set of values includes the initial vertex and the vertices of the region as discussed previously. The first and second output parameters represent results of the operation of the correspondence on the input parameter. According to the example above, the first output parameter is related to the delay and the second is related to power consumption. The correspondence in this case is provided by the functions required to calculate the output parameters which follow from the transistor sizes. Next, a first objective is defined for the first output parameter, and a second objective is defined which includes both output parameters. These objectives are, of course, a matter of design choice. For example, in one specific embodiment, the first objective is that all the values in the region are no more than one picosecond apart. In another variation, if the first output parameter represents the delay, and the second output parameter represents power consumption, then the objective which includes both parameters is: cost=$K_1$ *(Actual Delay−Target Delay)$^2$+$K_2$* power consumption, where $K_1$ and $K_2$ are constants. This equation provides an interrelation between the actual delay, target delay and the power consumption in a manner similar to previously described embodiments. Of course, this equation represents only one very specific embodiment, and numerous other objectives will occur to those of skill in the art depending on their particular design criteria.

After the above parameters and objectives have been defined, the method next involves determining a value for the input parameter having a first output parameter value which satisfies the first objective. When such a value for the input parameter has been determined, a first output parameter target value based on the first output parameter value is defined. Again, the target value will depend on the specific use of the present method. For example, in one embodiment the target value is simply a target delay which is defined to be 1.1 times the delay computed according to the first objective. The target delay thus represents something of a penalty as the method selects parameters which drive the actual delay beyond the target delay boundary. Finally, the method then determines a value for the input parameter having first and second output parameter values which satisfy the second objective, wherein the second objective includes the first parameter target value. Of course, the above embodiment is also useful in an iterative process where the steps of the method are repeated until satisfactory parameters are selected. Moreover, in further embodiments, this embodiment is also adaptable to the use of selecting new values located on a line defined by a centroid and a value furthest away from the desired objectives, as discussed in detail herein.

Of course, numerous variations in the weighting function will occur to those of skill in the art depending on the particularities of specific design requirements. It will be appreciated that in other embodiments of the invention, the total cost may be defined as a function of any number of variables and that the exact relationship between the variables is a matter of design choice.

Although the present invention has been described with reference to the above embodiments, those skilled in the art will recognize that numerous changes may be made in form and detail without departing from the scope and spirit of the present invention. For example, other circuit objectives and/or parameters such as transistor size, capacitance, etc. are optimized according to further embodiments of the invention. Moreover, the present invention may be applied to other non-electrical systems which are suitable for analysis under traditional operations research methods. In still further embodiments, the method may be particularized to more fully suit the needs of specific design requirements. For example, the distance factor used to calculate the distance of the new vertice from the centroid may be a simple scalar value, as described herein, or a more complex function of other design requirements or the number of iterations which have taken place. Similarly, the adjustments made to the distance factor as discussed in for instance, step 124, are also a matter of design choice and may either be simple scaler multipliers of the distance factor, or for complex functions, again depending on other parameters or the number of iterations performed.

All patents, patent applications and other publications referenced herein are hereby incorporated by reference as though set forth in full.

What is claimed is:

1. A method for computer aided optimization of a total cost of an electronic circuit, the total cost being a function of a primary cost and least one secondary cost, the primary and secondary costs being a function of circuit parameters, the method comprising:
   selecting an initial vertice, the vertice being defined by specific values of the circuit parameters;
   selecting a plurality of additional vertices required to define a region, each additional vertice being defined by a different set of circuit parameter values;
   simulating the circuit to determine the primary costs and the secondary costs associated with each vertice;
   applying a weighting function to the secondary costs which adjusts the secondary costs relative to the deviation of the secondary costs from a predetermined secondary cost target;
   aggregating the primary costs and the secondary costs to determine individual total costs associated with the vertices in the region;
   performing at least one iteration comprising:
      a) comparing the individual total costs associated with the vertices in the region with one another to determine a worst cost;
      b) determining a centroid defined by the vertices, excluding the vertice associated with the worst cost;
      c) determining a new vertice, the new vertice being located on a line defined by the vertice associated with the worst cost and the centroid, the new vertice being located at a distance away from the centroid, the distance being proportional to a distance factor;
      d) simulating the new vertice to determine a primary and a secondary cost associated with the new vertice;
      e) applying the weighting function to the new secondary cost to adjust the new secondary cost relative to the deviation of the new secondary cost from the predetermined secondary cost target;
      f) aggregating the new primary cost and the new secondary cost to determine a new total cost associated with the new vertice;
      g) comparing the new total cost associated with the new vertice with the worst cost;
      h) adjusting the distance factor and repeating steps c through g, if the total cost associated with the new vertice is not improved relative to the worst cost;
      i) comparing the total cost associated with the new vertice to termination criteria, if the total cost associated with the new vertice is improved relative to the worst cost.

2. A method as in claim 1 further comprising the steps of redefining the region by substituting the new vertice for the vertice associated with the worst cost and repeating the iteration, if the total cost associated with the new vertice does not meet termination criteria.

3. A method as in claim 1 further comprising the step of repeating the iteration until the total cost associated with the new vertice is improved relative to the worst cost, or until the total cost associated with the new vertice meets termination criteria.

4. A method as in claim 1 wherein adjusting the distance factor comprises reducing the distance factor so that the new vertice is located closer to the centroid.

5. A method as in claim 1 wherein adjusting the distance factor comprises multiplying the distance factor by a negative value so that the new vertice is located inside the region.

6. A method as in claim 1 wherein adjusting the distance factor comprises counting the number of consecutive times steps c through g are performed, and after a preset count has been reached, setting the distance factor to a value so that new vertices will be defined inside the region.

7. A method as in claim 1 wherein adjusting the distance factor comprises counting the number of consecutive times steps c through g are performed, and after a preset count has been reached, perturbing the centroid so that the new vertice is located on a line defined by the vertice associated with the worst cost and the perturbed centroid.

8. A method as in claim 1 wherein selecting a plurality of additional vertices comprises incrementing by one the number of parameters required to determine the cost.

9. A method as in claim 1 wherein selecting a plurality of additional vertices comprises randomly generating the additional vertices within a range of acceptable vertices.

10. A method as in claim 1 wherein selecting a plurality of additional vertices comprises determining the number of vertices required according to the relationship $C_1+(C_2*N)+(C_3*N^2)$, where $C_1$–$C_3$ are constants and N is the number of parameters required to determine the cost.

11. A method as in claim 1 wherein simulating the circuit to determine individual total costs associated with individual vertices comprises providing the circuit parameters associated with an individual vertice as input to a circuit analysis system which calculates the total cost associated with the vertice as a function of the parameters.

12. A machine having a memory which contains data representing a total cost of an electronic circuit, the total cost being a function of a primary cost and at least one secondary cost, the primary and secondary cost being a function of circuit parameters, the data being generated by a method comprising:

selecting an initial vertice, the vertice being defined by specific values of the circuit parameters;

selecting a plurality of additional vertices required to define a region, each additional vertice being defined by a different set of circuit parameter values;

simulating the circuit to determine the primary costs and the secondary costs associated with each vertice;

applying a weighting function to the secondary costs which adjusts the secondary costs relative to the deviation of the secondary costs from a predetermined secondary cost target;

aggregating the primary costs and the secondary costs to determine individual total costs associated with the vertices in the region;

performing at least one iteration comprising:
   a) comparing the individual total costs associated with the vertices in the region with one another to determine a worst cost;
   b) determining a centroid defined by the vertices, excluding the vertice associated with the worst cost;
   c) determining a new vertice, the new vertice being located on a line defined by the vertice associated with the worst cost and the centroid, the new vertice being located at a distance away from the centroid, the distance being proportional to a distance factor;
   d) simulating the new vertice to determine a new primary and secondary cost associated with the new vertice;
   e) applying the weighting function to the new secondary cost to adjust the new secondary cost relative to the deviation of the new secondary cost from the predetermined secondary cost target;
   f) aggregating the new primary cost and the new secondary cost to determine a new total cost associated with the new vertice;
   g) comparing the new total cost associated with the new vertice with the worst cost;
   h) adjusting the distance factor and repeating steps c through g, if the total cost associated with the new vertice is not improved relative to the worst cost;
   i) comparing the total cost associated with the new vertice to termination criteria, if the total cost associated with the new vertice is improved relative to the worst cost.

* * * * *